(12) United States Patent
Kitajima

(10) Patent No.: US 9,118,298 B2
(45) Date of Patent: Aug. 25, 2015

(54) HIGH FREQUENCY MODULE

(71) Applicant: Murata Manufacturing Co., Ltd., Nagaokakyo-shi, Kyoto-fu (JP)

(72) Inventor: Hiromichi Kitajima, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 14/527,886

(22) Filed: Oct. 30, 2014

(65) Prior Publication Data

US 2015/0054599 A1    Feb. 26, 2015

Related U.S. Application Data

(63) Continuation of application No. PCT/JP2013/058000, filed on Mar. 21, 2013.

(30) Foreign Application Priority Data

May 2, 2012    (JP) .................. 2012-105045

(51) Int. Cl.
*H03H 7/01*    (2006.01)
*H01P 1/203*   (2006.01)
(Continued)

(52) U.S. Cl.
CPC ......... *H03H 7/0115* (2013.01); *H01F 17/0013* (2013.01); *H01P 1/20345* (2013.01); *H03H 7/0138* (2013.01); *H03H 7/1766* (2013.01); *H01F 2017/0026* (2013.01); *H03H 2001/0085* (2013.01)

(58) Field of Classification Search
CPC ..................... H03H 2001/0085; H03H 7/0115

USPC ............................ 333/185, 168, 175
See application file for complete search history.

(56) References Cited

U.S. PATENT DOCUMENTS

2009/0033439 A1* 2/2009 Igarashi ................ 333/185
2009/0189715 A1* 7/2009 Sakisaka et al. ........... 333/185

FOREIGN PATENT DOCUMENTS

JP    3-86619 U      9/1991
JP    03-272213 A    12/1991
(Continued)

OTHER PUBLICATIONS

Official Communication issued in International Patent Application No. PCT/JP2013/058000, mailed on May 14, 2013.
(Continued)

*Primary Examiner* — Benny Lee
*Assistant Examiner* — Rakesh Patel
(74) *Attorney, Agent, or Firm* — Keating & Bennett, LLP

(57) ABSTRACT

A multilayered high frequency module includes inductor conductor patterns each defined by a linear conductor having a coiled shape on intermediate insulator layers of a multilayer body. A first spiral inductor with its axis extending in the stacking direction is defined by the inductor conductor patterns on respective layers connected through conductive via holes. Overlapped portions of inner regions of the individual inductor conductor patterns within the coiled shape define an air core portion of the first inductor. A capacitor conductor pattern is provided on one layer lower than the insulator layers on which the inductor conductor patterns are provided. The capacitor conductor pattern is a flat plate and located at a position not overlapping with the air core portion when looking at the multilayer body in a plan view.

13 Claims, 7 Drawing Sheets

(51) Int. Cl.
    *H01F 17/00*      (2006.01)
    *H03H 1/00*      (2006.01)

(56) References Cited

FOREIGN PATENT DOCUMENTS

| JP | 10-51257 A | 2/1998 |
|----|------------|--------|
| JP | 2002-170740 A | 6/2002 |
| JP | 2003-087074 A | 3/2003 |
| JP | 2004-079973 A | 3/2004 |
| JP | 2005-268935 A | 9/2005 |
| JP | 2008-271420 A | 11/2008 |

OTHER PUBLICATIONS

Official Communication issued in corresponding Japanese Patent Application No. 2014-513346, mailed on Jun. 16, 2015.

* cited by examiner

HIGH FREQUENCY MODULE

BACKGROUND OF THE INVENTION

1. Field of the Invention

The present invention relates to a high frequency module including an inductor that is provided inside a multilayer body by a conductor pattern, and a capacitor that is connected to the inductor.

2. Description of the Related Art

Hitherto, various types of high frequency modules have been devised in which conductor patterns are provided in insulator layers constituting a multilayer body, to thereby form an inductor and a capacitor inside the multilayer body. For example, Japanese Unexamined Patent Application Publication No. 2008-271420 discloses a high frequency module in which an FET switch including a common terminal connected to an antenna and a plurality of switching terminals is mounted on a surface of the multilayer body, and a low pass filter connected to the FET switch is constituted by an inductor and a capacitor formed inside the multilayer body.

The interior of the multilayer body of the above-mentioned high frequency module of the related art generally has a structure illustrated in FIGS. 12 and 13. FIG. 12 illustrates an exemplary inner configuration of a multilayer body 100P constituting the related-art high frequency module, when looking at the multilayer body 100P from the lateral surface side thereof. FIG. 13 illustrates an exemplary configuration of inner conductors in the multilayer body 100P constituting the related-art high frequency module, when seeing through the multilayer body 100P from the top surface side thereof. It is to be noted that, while the high frequency module includes the multilayer body 100P and mount-type components, such as a switch element, which are mounted to the top surface of the multilayer body 100P, the mount-type components are not illustrated in FIGS. 12 and 13.

The multilayer body 100P is formed by stacking a plurality of insulator layers 101. In upper one of the insulator layers, layout conductors 200 are mainly formed to connect the mount-type components to circuit elements formed inside the multilayer body 100P. In a layer under the upper insulator layer where the layout conductors 200 are formed, an inner ground conductor pattern 300U is arranged to extend substantially over an entire surface of the layer.

Inductor conductor patterns 401P and 402P constituting respective inductors are provided on intermediate layers of the multilayer body 100P. The inductor conductor patterns 401P and 402P are each provided on a spiral shape with a spiral axis extending in a stacking direction. Thus, respective axial directions of the inductors formed by the inductor conductor patterns 401P and 402P extend in the stacking direction.

Capacitor conductor patterns 501P, 502P and 503P constituting capacitors are provided on layers under the intermediate layers of the multilayer body 100P where the inductor conductor patterns 401P and 402P are formed. The capacitor conductor patterns 501P, 502P and 503P are each a conductor in the form of a flat plate that is parallel to the corresponding layer and that has a predetermined area.

Just above a lowermost layer of the multilayer body 100P, an inner ground pattern 300D is arranged to extend substantially over an entire surface of the layer.

Meanwhile, in the related-art high frequency module described above, miniaturization is demanded, and the spacing between the inductor conductor patterns 401P, 402P and the capacitor conductor patterns 501P, 502P and 503P is inevitably narrowed with further size reduction.

For example, in the case of the structure where the inductor conductor patterns 401P and the capacitor conductor pattern 501P are arranged, as illustrated in FIGS. 12 and 13, in overlapped relation for size reduction when looking at the multilayer body 100P in a plan view (i.e., when looking at the multilayer body 100P in a direction perpendicular to the top surface thereof), a distance G0 (taken along the stacking direction) between the inductor conductor patterns 401P and the capacitor conductor pattern 501P is shortened.

Thus, because the axial direction of the inductor formed by the inductor conductor patterns 401P is parallel to the stacking direction, the distance from the inductor formed by the inductor conductor patterns 401P to the flat-plate conductor constituting the capacitor conductor pattern 401P is shortened.

In the above-described structure, a magnetic field generated from the inductor is blocked off by the capacitor conductor pattern. As a result, a Q value of the inductor deteriorates, and circuit characteristics of a filter, including the inductor, and of the high frequency module degrade.

SUMMARY OF THE INVENTION

Accordingly, preferred embodiments of the present invention provide a multilayered high frequency module in which a Q value of an inductor incorporated in the module does not deteriorate even when the module size is reduced.

The high frequency module according to a preferred embodiment of the present invention includes a multilayer body including a plurality of insulator layers stacked on each other, a spiral inductor that has an axial direction aligned with a stacking direction of the insulator layers, and that includes inductor conductor patterns inside the multilayer body, and a capacitor including capacitor conductor patterns that include at least one pair of flat-plate conductors provided in different ones of the insulator layers parallel or substantially parallel to the insulator layers, wherein at least one of the flat-plate conductors constituting the capacitor conductor patterns is provided at a position different from an air core portion of the inductor, which is defined by the inductor conductor patterns, when looking at the multilayer body from a direction along the stacking direction.

With the features described above, a magnetic field generated from the inductor is prevented from being blocked off by the flat-plate conductors of the capacitor conductor patterns. As a result, degradation of a Q value of the inductor is significantly reduced or prevented.

The high frequency module according to a preferred embodiment of the present invention is preferably constituted as follows. The inductor conductor patterns and the capacitor conductor patterns are provided on different ones of the insulator layers. The capacitor conductor patterns include a first flat-plate conductor and a second flat-plate conductor that are opposed to each other in the stacking direction. The first flat-plate conductor is provided on the insulator layer closer to the inductor conductor patterns than the insulator layer on which the second flat-plate conductor is provided. The first flat-plate conductor is provided at a position different from the air core portion of the inductor, which is defined by the inductor conductor patterns, when looking at the multilayer body from the direction along the stacking direction.

The features described above represent the case where the inductor and the capacitor are defined by different ones of the insulator layers inside the multilayer body. Since the first flat-plate conductor of the capacitor conductor patterns, which is closer to the inductor, is spaced away from a region where the magnetic field generated from the inductor passes, degradation of a Q value of the inductor is significantly reduced or prevented.

In the high frequency module according to a preferred embodiment of the present invention, preferably, the second flat-plate conductor is provided at a position different from the air core portion of the inductor, which is defined by the inductor conductor patterns, when looking at the multilayer body from the direction along the stacking direction.

With the feature described above, since not only the first flat-plate conductor closer to the inductor, but also the second flat-plate conductor that is more remote from the inductor are positioned away from the region where the magnetic field generated from the inductor passes, degradation of a Q value of the inductor is further reduced or prevented.

In the high frequency module according to a preferred embodiment of the present invention, the second flat-plate conductor may include a cutout or a void in which no conductors are provided, the cutout or the void being provided at a position overlapping with the air core portion of the inductor, which is defined by the inductor conductor patterns, when looking at the multilayer body from the direction along the stacking direction.

With the feature described above, since the flat-plate conductor is not present only in the region of the second flat-plate conductor where the magnetic field generated from the inductor passes, degradation of a Q value of the inductor is significantly reduced or prevented. In addition, it is possible to more easily ensure a larger area where the flat-plate conductors are opposed to each other, and to realize the desired capacitance.

In the high frequency module according to a preferred embodiment of the present invention, the capacitor conductor patterns preferably are provided on the insulator layers on which the inductor conductor patterns are provided.

With the feature described above, the inductor conductor patterns and the capacitor conductor patterns are arranged side by side in a direction perpendicular or substantially perpendicular to the stacking direction (i.e., a direction parallel to the insulator layers). Thus, since the flat-plate conductors constituting the capacitor conductor patterns are not present in the axial direction of the inductor, the magnetic field generated from the inductor is prevented from being blocked off by those flat-plate conductors. As a result, degradation of a Q value of the inductor is significantly reduced or prevented.

The high frequency module according to a preferred embodiment of the present invention is preferably constituted as follows. The inductor conductor patterns include a first inductor conductor pattern and a second inductor conductor pattern, which constitute different inductors. The capacitor conductor patterns are located between the first inductor conductor pattern and the second inductor conductor pattern when looking at the multilayer body from the direction along the stacking direction.

With the features described above, coupling between the first inductor constituted by the first inductor conductor pattern and the second inductor constituted by the second inductor conductor pattern is significantly reduced or prevented. As a result, circuit characteristics of a circuit (e.g., a filter circuit) including the first inductor and the second inductor are greatly improved.

In the high frequency module according to a preferred embodiment of the present invention, preferably, the first inductor constituted by the first inductor conductor pattern and the second inductor constituted by the second inductor conductor pattern are same in a winding direction.

With the feature described above, since the directions of magnetic fields generated from the first inductor and the second inductor are the same, coupling between both the inductors is further significantly reduced or prevented.

With various preferred embodiments of the present invention, a multilayered high frequency module in which an inductor incorporated in the module and a circuit including the inductor have good characteristics is provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
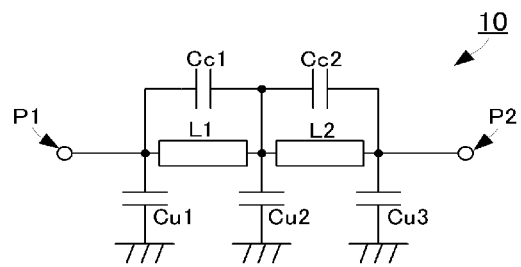
FIG. 1 is a circuit diagram of a low pass filter included in a high frequency module according to a first preferred embodiment of the present invention.

A high frequency module according to a first preferred embodiment of the present invention will be described below with reference to the drawings. FIG. 1 is a circuit diagram of a low pass filter 10 included in the high frequency module according to the first preferred embodiment of the present invention. It is to be noted that this preferred embodiment is described in connection with a low pass filter, for example, but the features of this preferred embodiment can be applied to various circuits insofar as they include inductors and capacitors.

The low pass filter 10 includes a first input/output port P1 and a second input/output port P2. A first inductor L1 and a second inductor L2 are connected in series between the first input/output port P1 and the second input/output port P2. A first capacitor Cc1 is connected in parallel to the first inductor L1. A second capacitor Cc2 is connected in parallel to the second inductor L2. An end of the first inductor L1 at the side nearer to the first input/output port P1 is grounded through a third capacitor Cu1. A connected point between the first inductor L1 and the second inductor L2 is grounded through a fourth capacitor Cu2. An end of the second inductor L2 at the side nearer to the second input/output port P2 is grounded through a fifth capacitor Cu3.

The low pass filter 10 having the above-described circuit configuration includes conductor patterns that are provided inside the multilayer body 100.

Figure 2:
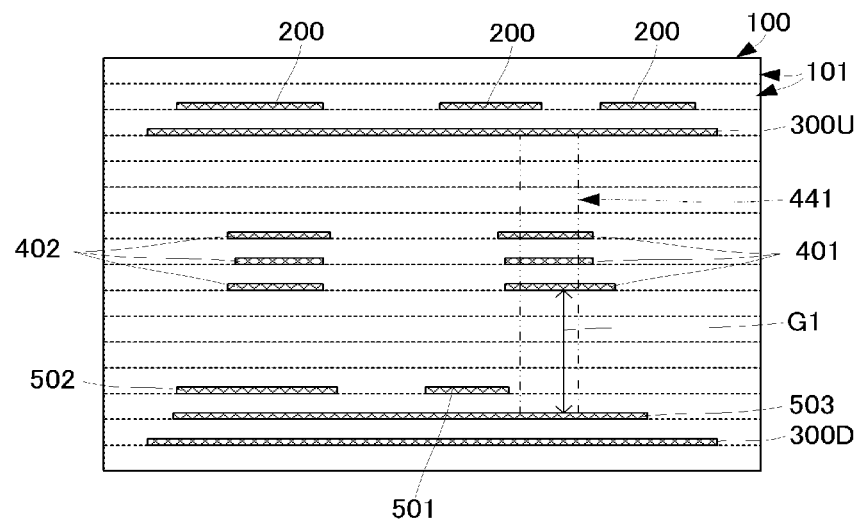
FIG. 2 illustrates an exemplary inner configuration of a multilayer body implementing the high frequency module according to the first preferred embodiment of the present invention, when looking at the multilayer body from the lateral surface side thereof.
Figure 3:
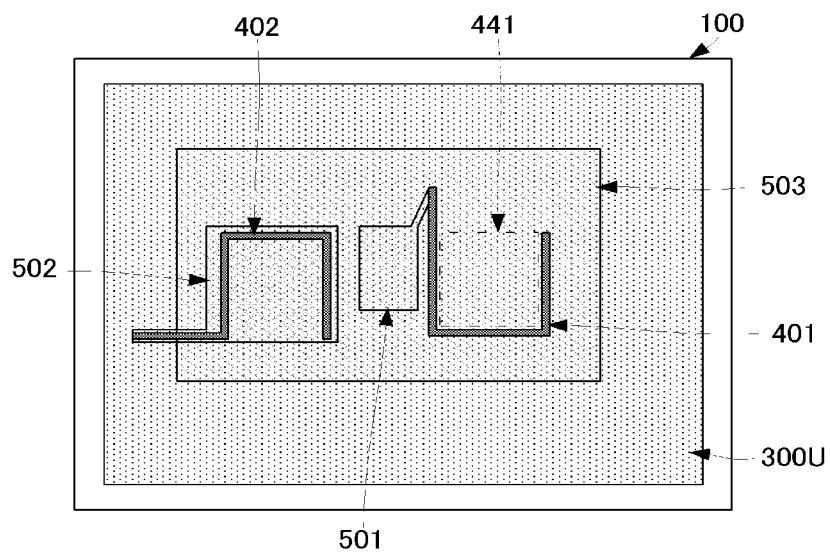
FIG. 3 illustrates an exemplary configuration of inner conductor patterns in the multilayer body constituting the high frequency module according to the first preferred embodiment of the present invention, when seeing through the multilayer body from the top surface side thereof.

FIG. 2 illustrates an exemplary inner configuration of the multilayer body 100 implementing the high frequency module according to the first preferred embodiment of the present invention, when looking at the multilayer body 100 from the lateral surface side thereof. FIG. 3 illustrates an exemplary configuration of inner conductor patterns in the multilayer body 100 constituting the high frequency module according to the first preferred embodiment of the present invention, when seeing through the multilayer body 100 from the top surface side thereof. It is to be noted that FIGS. 2 and 3 do not illustrate all conductor patterns provided in the low pass filter 10, but illustrate only conductor patterns related to the features of the present invention. Moreover, while this preferred embodiment illustrates a non-limiting example in which the multilayer body 100 is formed preferably by stacking sixteen insulator layers 101, the number of the insulator layers 101 to be stacked is not limited to sixteen, and it may be determined, as required, depending on specifications.

The multilayer body 100 is preferably formed by stacking sixteen insulator layers 101, for example. Various types of mount-type circuit components constituting the high frequency module are mounted to a top surface of the multilayer body 100. Layout conductors 200 are provided on upper ones of the insulator layers (e.g., in first and second layers from the top surface side in FIG. 2) of the multilayer body 100 (while the layout conductors 200 are provided only on the second layer in FIG. 2, they may be provided on the first layer as well). The layout conductors 200 are conductor patterns to define wiring to connect the mount-type circuit components to inductors and capacitors, which are provided on intermediate or lower layers as described later.

An inner ground conductor pattern 300U is provided on a predetermined conductor layer (third layer from the top surface in FIG. 2) that partitions the upper and intermediate layers of the multilayer body 100. The inner ground conductor pattern 300U preferably is configured to extend substantially over an entire surface of the insulator layer.

Inductor conductor patterns 401 and 402 are provided on plural ones (seventh to ninth layers from the top surface side in FIG. 2) among the intermediate layers of the multilayer body 100. The inductor conductor patterns 401 and 402 each include a linear conductor. The inductor conductor patterns 401 and 402 each preferably have a coiled shape, which is partly disconnected, when looked at in a plan view (i.e., when looking at the multilayer body 100 in a direction perpendicular to the top surface of the multilayer body 100, namely when looking at the multilayer body 100 in the stacking direction).

The individual inductor conductor patterns 401 provided on respective layers are arranged such that their inner regions within the coiled shape are overlapped with each other when looked at in a plan view. The individual inductor conductor patterns 401 provided on the respective layers are connected through conductive via holes to constitute one continuous conductor pattern. With such a configuration, a first spiral inductor with its axis extending in the stacking direction is defined by the individual inductor conductor patterns 401 provided in the respective layers and the connecting conductive via holes. Overlapped portions of the inner regions of the individual inductor conductor patterns 401 within the coiled shape define an air core portion 441 of the first inductor.

The individual inductor conductor patterns 402 provided on respective layers are arranged such that their inner regions within the coiled shape are overlapped with each other when looked at in a plan view. The individual inductor conductor patterns 402 provided on the respective layers are connected through conductive via holes to constitute one continuous conductor pattern. With such a configuration, a second spiral inductor with its axis extending in the stacking direction is defined by the individual inductor conductor patterns 402 provided in the respective layers and the connecting conductive via holes.

The first inductor L1 and the second inductor L2, illustrated in FIG. 1, are defined respectively by the above-mentioned first inductor and second inductor.

Capacitor conductor patterns 501 and 502 are provided on a predetermined layer (thirteenth layer from the top surface side in FIG. 2) that constitutes one of lower layers of the multilayer body 100. A capacitor conductor pattern 503 is provided on another predetermined layer (fourteenth layer from the top surface side in FIG. 2) that constitutes another one of the lower layers of the multilayer body 100.

The capacitor conductor patterns 501, 502 and 503 each include a conductor pattern in the form of a flat plate (e.g., a rectangular plate) that has a predetermined area, and that has a flat surface parallel or substantially parallel to a flat surface of the insulator layer on which the corresponding capacitor conductor pattern is provided.

The capacitor conductor pattern 501 and the capacitor conductor pattern 503 are provided in opposing relation over a predetermined area. With such an arrangement, a first capacitor is provided.

The capacitor conductor pattern 502 and the capacitor conductor pattern 503 are also arranged in opposing relation over a predetermined area. With such an arrangement, a second capacitor is provided. The opposing area between the capacitor conductor patterns 501 and 503 and the opposing area between the capacitor conductor patterns 502 and 503 are set as appropriate depending on specifications, and those opposing areas may be the same or different from each other.

The interconnected capacitors (e.g., the first capacitor Cc1 and the second capacitor Cc2), illustrated in FIG. 1, are defined respectively by the above-mentioned first capacitor and second capacitor.

An inner ground conductor pattern 300D is provided at the upper surface side of a lowermost insulator layer of the multilayer body 100. The inner ground conductor pattern 300D is preferably configured to extend substantially over an entire surface of the insulator layer.

Land conductors for external connection are provided at a rear surface of the multilayer body 100 (i.e., a rear surface of the lowermost insulator layer).

Conductive via holes and predetermined layout patterns are provided on plural insulator layers (fourth to sixth layers from the top surface side in FIG. 2) between the insulator layer on which the inner ground conductor pattern 300U is provided and uppermost one, closest to the top surface of the multilayer body 100, of the insulator layers on which the inductor conductor patterns 401 and 402 are provided. However, those conductive via holes and predetermined layout patterns are provided at positions not overlapping with the air core portion 441 of the first inductor and the air core portion of the second inductor when looking at the multilayer body 100 in a plan view.

Conductive via holes and predetermined layout patterns are further provided on plural insulator layers (tenth to twelfth layers from the top surface side in FIG. 2) between rearmost one of the insulator layers on which the inductor conductor patterns 401 and 402 are provided and the insulator layer on which the capacitor conductor patterns 501 and 502 are provided. However, those conductive via holes and predetermined layout patterns are provided at positions not overlapping with the air core portion 441 of the first inductor and the air core portion of the second inductor when looking at the multilayer body 100 in a plan view.

In the above-described configuration, as illustrated in FIGS. 2 and 3, the capacitor conductor pattern 501 constituting the first capacitor is configured to be not overlapped with the air core portion 441 of the first inductor, which is defined by the inductor conductor patterns 401, when looking at the multilayer body 100 in a plan view.

Figure 12:
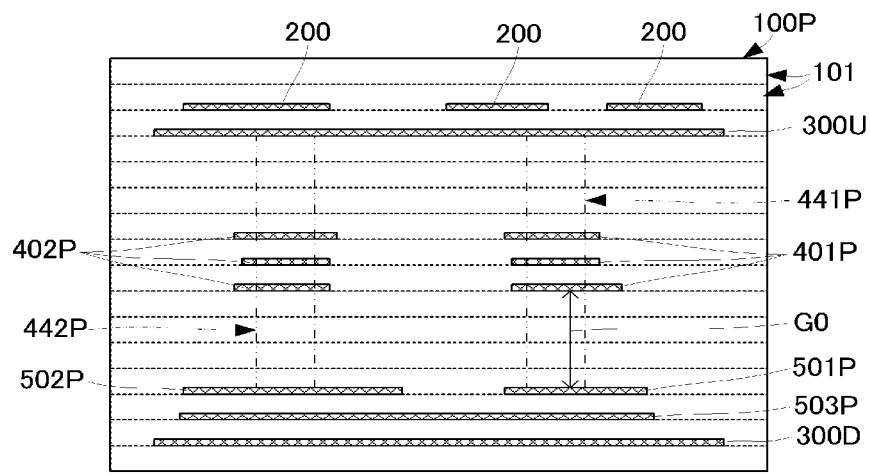
FIG. 12 illustrates an exemplary inner configuration of a multilayer body constituting a high frequency module of related art, when looking at the multilayer body from the lateral surface side thereof.
Figure 13:
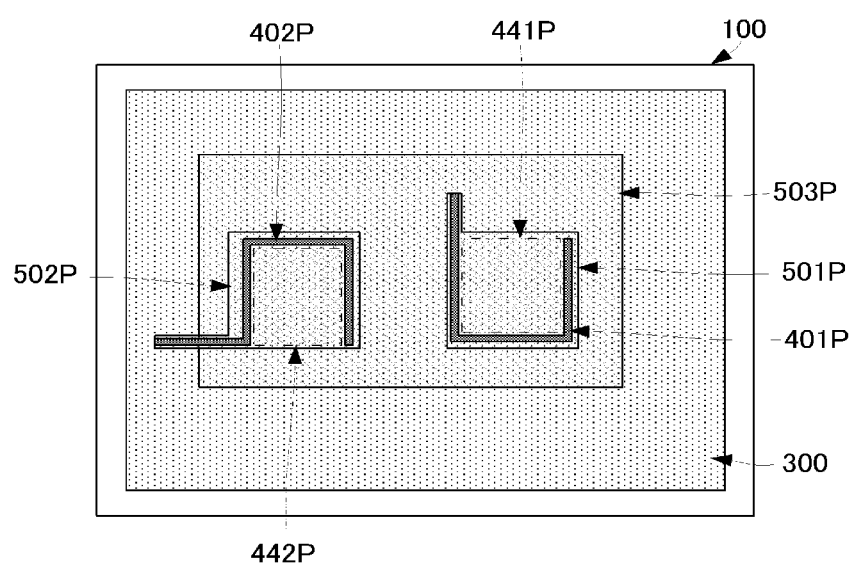
FIG. 13 illustrates an exemplary configuration of inner conductor patterns in the multilayer body constituting the related-art high frequency module, when seeing through the multilayer body from the top surface side thereof.

With the configuration described above, a length G1 of a region, which is defined by extending the air core portion 441 of the first inductor in a direction toward the rear surface of the multilayer body 100 and in which there are no conductors, is larger than the corresponding length G0 in the related art (see FIG. 12). As a result, a magnetic field generated from the first inductor is less apt to be blocked off and characteristics of the first inductor are improved in comparison with the related art. Thus, circuit characteristics of a circuit including the first inductor, e.g., a filter circuit such as the low pass filter illustrated in FIG. 1, is significantly improved.

Furthermore, in the configuration of this preferred embodiment, since the inductor conductor patterns 401 and the capacitor conductor pattern 503 are opposed to each other in the stacking direction, a certain amount of capacitance is obtained with the inductor conductor patterns 401 and the capacitor conductor pattern 503. Accordingly, the shape of the capacitor conductor pattern constituting the capacitor, which is connected in parallel to the first inductor, is much smaller in size. For example, when the first inductor L1 is constituted by the inductor conductor patterns 401 and the first capacitor Cc1 is constituted by the capacitor conductor patterns 501 and 503, the area of the capacitor conductor pattern 501 is significantly reduced. As a result, it is easier to provide the capacitor conductor pattern 501 at a position not overlapping with the air core portion 441 of the first inductor when looking at the multilayer body 100 in a plan view.

Figure 4:
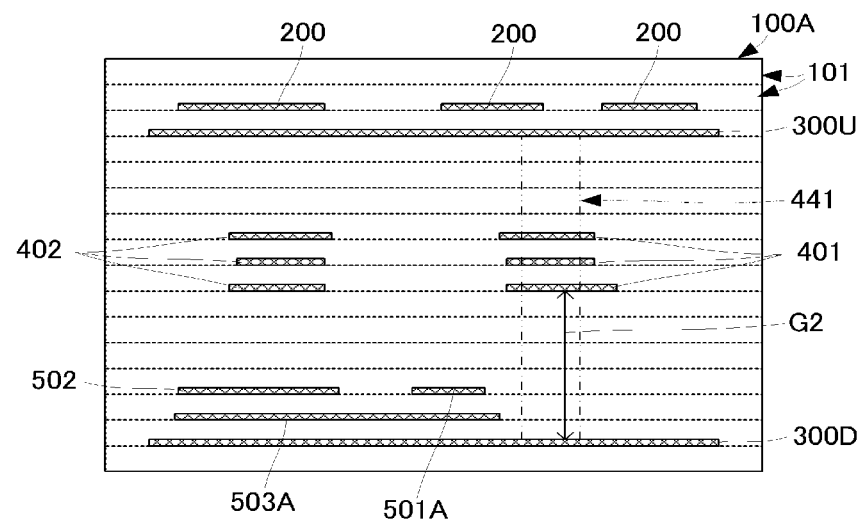
FIG. 4 illustrates an exemplary inner configuration of a multilayer body implementing a high frequency module according to a second preferred embodiment of the present invention, when looking at the multilayer body from the lateral surface side thereof.
Figure 5:
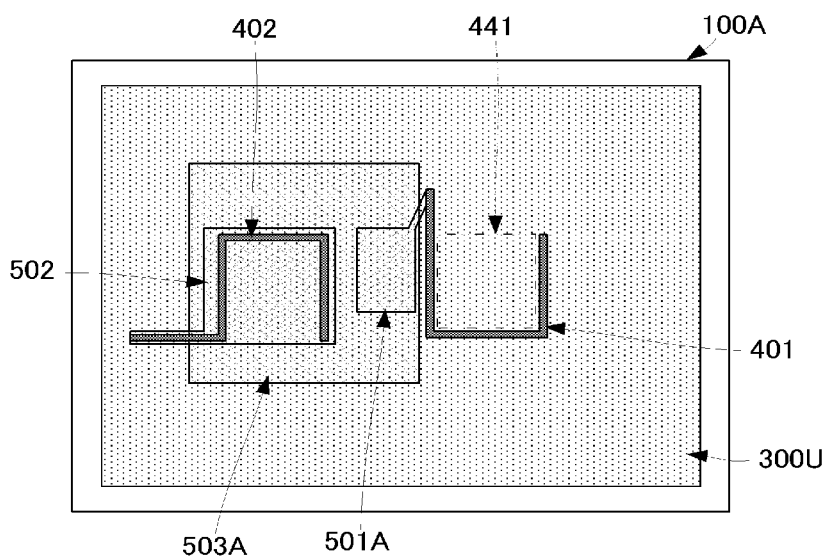
FIG. 5 illustrates an exemplary configuration of inner conductor patterns in the multilayer body constituting the high frequency module according to the second preferred embodiment of the present invention, when seeing through the multilayer body from the top surface side thereof.

A high frequency module according to a second preferred embodiment of the present invention will be described below with reference to the drawings. FIG. 4 illustrates an exemplary inner configuration of a multilayer body 100A implementing the high frequency module according to the second preferred embodiment of the present invention, when looking at the multilayer body 100A from the lateral surface side thereof. FIG. 5 illustrates an exemplary configuration of inner conductor patterns in the multilayer body 100A constituting the high frequency module according to the second preferred embodiment of the present invention, when seeing through the multilayer body 100A from the top surface side thereof.

The multilayer body 100A according to the second preferred embodiment is different in shape of a capacitor conductor pattern 503A from the multilayer body 100 according to the first preferred embodiment, and the other configuration is the same. Therefore, the different point is described in detail below.

As illustrated in FIGS. 4 and 5, the capacitor conductor pattern 503A is provided on one insulator layer 101 lower than the insulator layer 101 on which the capacitor conductor patterns 501 and 502 are provided. The capacitor conductor pattern 503A is configured to oppose each of the capacitor conductor patterns 501 and 502 over a predetermined area.

As illustrated in FIGS. 4 and 5, the capacitor conductor pattern 503A is not overlapped with the air core portion 441 of the first inductor, which is defined by the inductor conductor patterns 401, when looking at the multilayer body 100A in a plan view.

With the above-described configuration, a length G2 of a region, which is defined by extending the air core portion 441 of the first inductor in a direction toward a rear surface of the multilayer body 100A and in which there are no conductors, is larger than the corresponding length G1 in the first preferred embodiment. As a result, a magnetic field generated from the first inductor is even less apt to be blocked off and characteristics of the first inductor are further improved in comparison with the first preferred embodiment. Thus, circuit characteristics of a circuit including the first inductor, e.g., a filter circuit such as the low pass filter illustrated in FIG. 1, are further improved.

Figure 6:
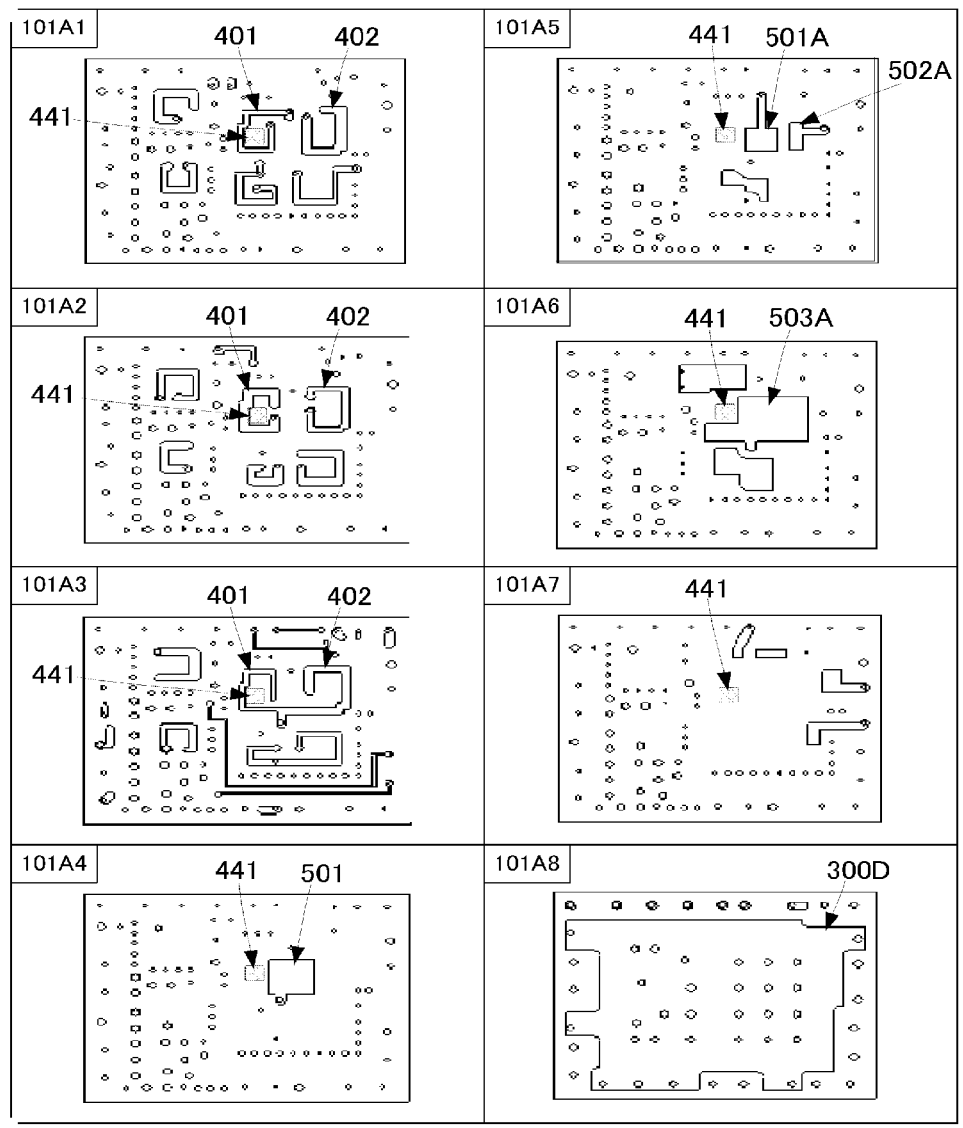
FIG. 6 illustrates, in a manner separated into individual stacked layers, a detailed multilayer structure of the multilayer body according to the second preferred embodiment of the present invention.

FIG. 6 illustrates, in a manner separated into individual stacked layers, a detailed multilayer structure of the multilayer body 100A according to the second preferred embodiment of the present invention. It is to be noted that FIG. 6 does not illustrate all the insulator layers constituting the multilayer body 100A according to the second preferred embodiment of the present invention, but illustrates only the insulator layers related to the features of the present invention in an extracted manner.

The inductor conductor patterns 401 and 402, each including a linear conductor pattern having a coiled shape, are provided on each of insulator layers 101A1, 101A2 and 101A3. The individual inductor conductor patterns 401 and 402 on the respective layers are connected through conductive via holes per pattern group. Thus, the first inductor is defined by the individual inductor conductor patterns 401 and the conductive via holes, and the second inductor is defined by the individual inductor conductor patterns 402 and the conductive via holes.

The capacitor conductor pattern 501 is provided on an insulator layer 101A4. The capacitor conductor pattern 501 is provided at a position not overlapping with the air core portion 441 of the first inductor when looked at in a plan view.

The capacitor conductor patterns 501A and 502A are provided on an insulator layer 101A5. The capacitor conductor pattern 501A is provided at a position opposing to the capacitor conductor pattern 501 in the insulator layer 101A4 and not overlapping with the air core portion 441 of the first inductor when looked at in a plan view. The capacitor conductor pattern 502A is provided at a position not overlapping with the air core portion 441 of the first inductor when looked at in a plan view.

The capacitor conductor pattern 503A is provided on an insulator layer 101A6. The capacitor conductor pattern 503A is provided at a position opposing to each of the capacitor conductor patterns 501A and 502A in the insulator layer 101A5 when looked at in a plan view. The capacitor conductor pattern 503A is provided at a position not overlapping with the air core portion 441 of the first inductor when looked at in a plan view.

Various layout patterns and conductive via holes are provided on an insulator layer 101A7. Those various layout patterns and conductive via holes are provided at positions not overlapping with the air core portion 441 of the first inductor when looked at in a plan view.

The inner ground conductor pattern 300D is provided on an insulator layer 101A8. The inner ground conductor pattern 300D is provided to extend substantially over an entire surface of the insulator layer 108A.

With the above-described configuration, there are no conductors in a region, which extends through the four insulator layers 101A4, 101A5, 101A6 and 101A7 lower than the insulator layer 101A3 that is lowermost one of the insulator layers where the inductor conductor patterns 401 constituting the first inductor are provided, and which is overlapped with the air core portion 441 of the first inductor when looking at the multilayer body 100A in a plan view. As a result, a length of a region, which is defined by extending the air core portion 441 of the first inductor in a direction toward the rear surface of the multilayer body 100A and in which there are no conductors, are increased. Thus, characteristics of the first inductor are greatly improved.

Figure 7:
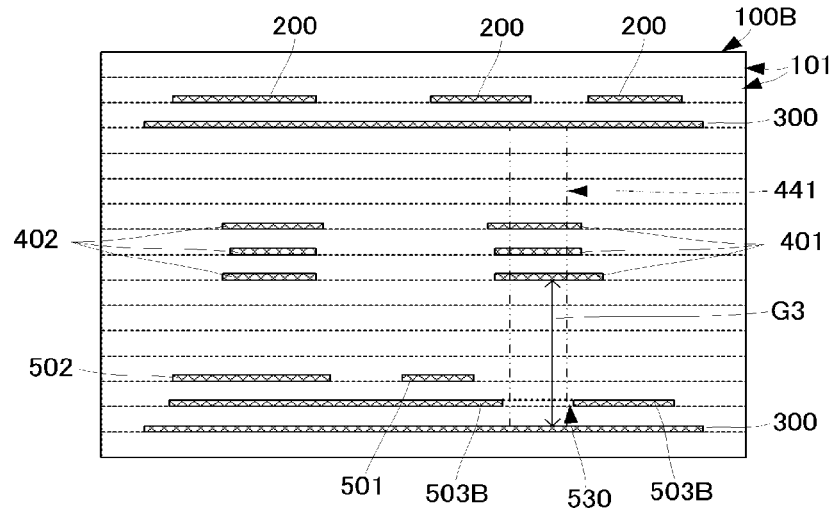
FIG. 7 illustrates an exemplary inner configuration of a multilayer body implementing a high frequency module according to a third preferred embodiment of the present invention, when looking at the multilayer body from the lateral surface side thereof.
Figure 8:
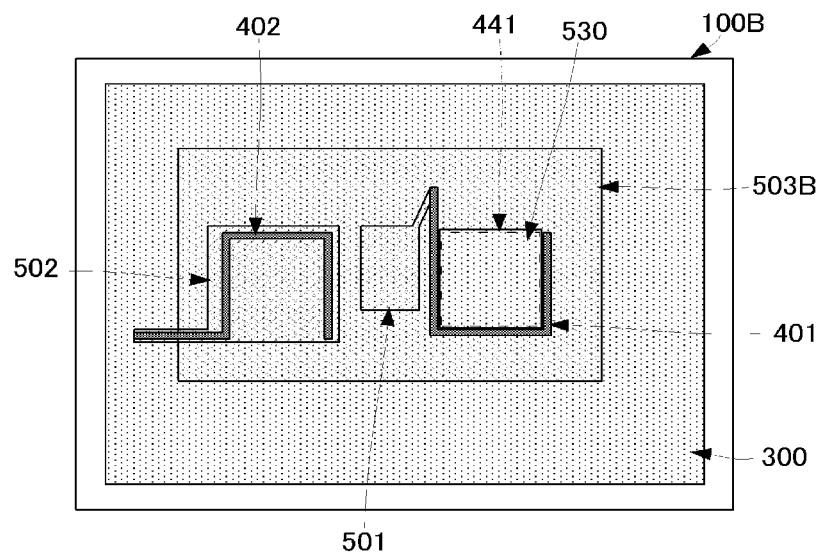
FIG. 8 illustrates an exemplary configuration of inner conductor patterns in the multilayer body constituting the high frequency module according to the third preferred embodiment of the present invention, when seeing through the multilayer body from the top surface side thereof.

A high frequency module according to a third preferred embodiment of the present invention will be described below with reference to the drawings. FIG. 7 illustrates an exemplary inner configuration of a multilayer body 100B implementing the high frequency module according to the third preferred embodiment of the present invention, when looking at the multilayer body 100B from the lateral surface side thereof. FIG. 8 illustrates an exemplary configuration of inner conductor patterns in the multilayer body 100B constituting the high frequency module according to the third preferred embodiment of the present invention, when seeing through the multilayer body 100B from the top surface side thereof.

The multilayer body 100B according to the third preferred embodiment is different in shape of a capacitor conductor pattern 503B from the multilayer body 100 according to the first preferred embodiment, and the other configuration is preferably the same. Therefore, the different point is described in detail below.

As illustrated in FIGS. 7 and 8, the capacitor conductor pattern 503B is provided on one insulator layer 101 lower than the insulator layer 101 on which the capacitor conductor patterns 501 and 502 are provided. The capacitor conductor pattern 503B is configured to oppose each of the capacitor conductor patterns 501 and 502 over a predetermined area.

As illustrated in FIGS. 7 and 8, the capacitor conductor pattern 503B includes a void 503 in which no conductor is provided, the void 503 being provided in a region overlapping with the air core portion 441 of the first inductor, which is defined by the inductor conductor patterns 401, when looking at the multilayer body 100B in a plan view.

Also with the above-described configuration, the air core portion 441 of the first inductor and the capacitor conductor pattern 503B are not overlapped with each other, when looking at the multilayer body 100B in a plan view. Accordingly, a length G3 of a region, which is defined by extending the air core portion 441 of the first inductor in a direction toward a rear surface of the multilayer body 100B and in which there are no conductors, is larger than the corresponding length G1 in the first preferred embodiment. As a result, a magnetic field generated from the first inductor is even less apt to be blocked off and characteristics of the first inductor are further improved in comparison with the first preferred embodiment. Thus, circuit characteristics of a circuit including the first inductor, e.g., a filter circuit such as the low pass filter illustrated in FIG. 1, are further improved.

Moreover, the capacitor conductor pattern 503B are preferably provided in a larger area than the capacitor conductor pattern 503A in the second preferred embodiment. Accordingly, an allowable range of the area of the capacitor conductor pattern 503B is increased, and the desired capacitance is realized more easily. Furthermore, in the configuration illustrated in FIGS. 7 and 8, since the inductor conductor patterns 401 and the capacitor conductor pattern 503B are opposed to each other in the stacking direction, a certain amount of capacitance is obtained with the inductor conductor patterns 401 and the capacitor conductor pattern 503B. Accordingly, the shape of the capacitor conductor pattern constituting the capacitor, which is connected in parallel to the first inductor, is much smaller in size. For example, when the first inductor L1 includes the inductor conductor patterns 401 and the first capacitor Cc1 includes the capacitor conductor patterns 501 and 503B, the area of the capacitor conductor pattern 501 is reduced. As a result, it is easier to provide the capacitor conductor pattern 501 at a position not overlapping with the air core portion 441 of the first inductor when looking at the multilayer body 100 in a plan view.

With the configuration of this preferred embodiment, as described above, a degree of freedom in design of patterns to form the capacitor conductor patterns is increased while characteristics of the inductor are further improved.

Figure 9:
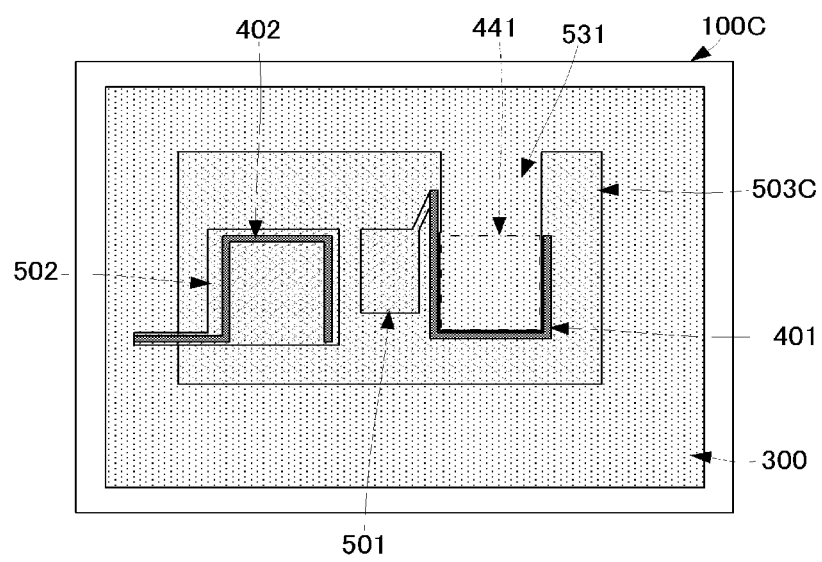
FIG. 9 illustrates an exemplary configuration of inner conductor patterns in a multilayer body implementing the high frequency module according to a fourth preferred embodiment of the present invention, when seeing through the multilayer body from the top surface side thereof.

A high frequency module according to a fourth preferred embodiment of the present invention will be described below with reference to the drawings. FIG. 9 illustrates an exemplary configuration of inner conductor patterns in a multilayer body 100C implementing the high frequency module according to the fourth preferred embodiment of the present invention, when seeing through the multilayer body 100C from the top surface side thereof.

The multilayer body 100C according to the third preferred embodiment is different in shape of a capacitor conductor pattern 503C from the multilayer body 100B according to the third preferred embodiment, and the other configuration preferably is the same. Therefore, the different point is described in detail below.

The void 530 is present in the capacitor conductor pattern 503B in the third preferred embodiment, whereas a cutout 531 is provided in the capacitor conductor pattern 503C.

The cutout 531 is provided by forming the capacitor conductor pattern 503C such that a conductor-non-formed portion is provided in the capacitor conductor pattern 503C in a configuration including a region overlapped with the air core portion 441 of the first inductor, which is defined by the inductor conductor patterns 401, when looking at the multilayer body 100C in a plan view.

The above-described configuration also provides similar advantageous effects in operation to those of the high frequency module that is constituted by the multilayer body 100C according to the third preferred embodiment.

Figure 10A:
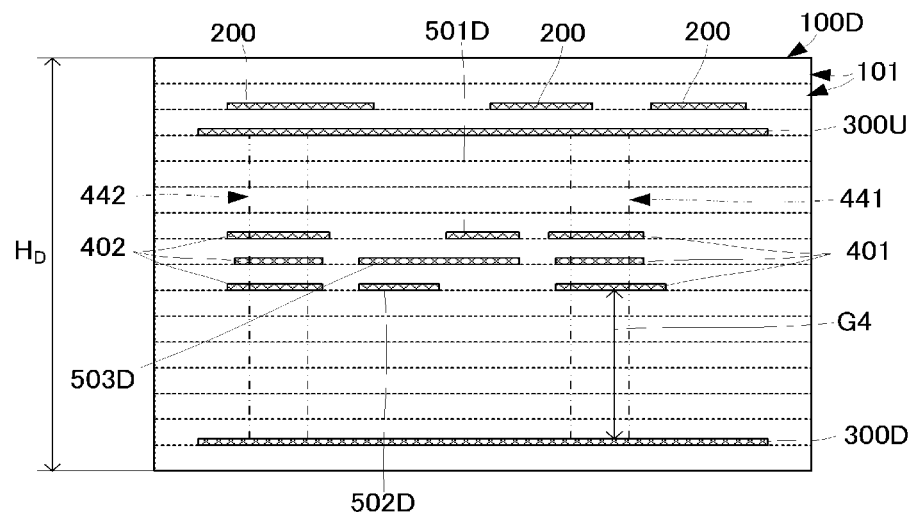
FIGS. 10A and 10B illustrate an exemplary inner configuration of a multilayer body implementing a high frequency module according to a fifth preferred embodiment of the present invention, when looking at the multilayer body from the lateral surface side thereof, and further illustrate an exemplary inner configuration of a multilayer body implementing the high frequency module according to the fifth preferred embodiment of the present invention, when looking at the multilayer body from the lateral surface side thereof.
Figure 10B:
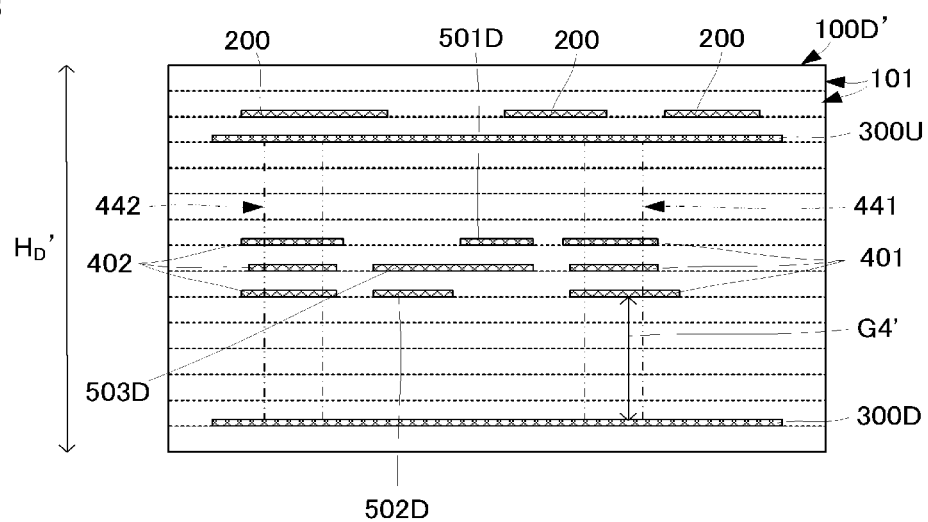

A high frequency module according to a fifth preferred embodiment will be described below with reference to the drawings. FIG. 10A illustrates an exemplary inner configuration of a multilayer body 100D implementing the high frequency module according to the fifth preferred embodiment of the present invention, when looking at the multilayer body 100D from the lateral surface side thereof. FIG. 10B illustrates an exemplary inner configuration of a multilayer body 100D' implementing the high frequency module according to the fifth preferred embodiment of the present invention, when looking at the multilayer body 100D' from the lateral surface side thereof.

In brief, while the above-described preferred embodiments represent the case where the inductor conductor patterns and the capacitor conductor patterns are provided on different insulator layers of the multilayer body, the capacitor conductor patterns are provided in this preferred embodiment on plural insulator layers on which the inductor conductor patterns are provided.

Upper layers of the multilayer body 100D illustrated in FIG. 10A preferably are the same as those in the multilayer body 100 described in the first preferred embodiment.

Inductor conductor patterns 401 and 402 are provided on plural ones (seventh to ninth layers from the top surface side in FIGS. 10A and 10B) among intermediate layers of the multilayer body 100D. The inductor conductor patterns 401 and 402 each include a linear conductor. The inductor conductor patterns 401 and 402 each preferably have a coiled shape, which is partly disconnected, when looked at in a plan view.

The individual inductor conductor patterns 401 provided on respective layers are arranged such that their inner regions within the coiled shape are overlapped with each other when looked at in a plan view. The individual inductor conductor patterns 401 provided on the respective layers are connected through conductive via holes to constitute one continuous conductor pattern. With such a configuration, a first spiral inductor with its axis extending in the stacking direction is defined by the individual inductor conductor patterns 401 provided in the respective layers and the connecting conductive via holes. Overlapped portions of the inner regions of the individual inductor conductor patterns 401 within the coiled shape define an air core portion 441 of the first inductor.

The individual inductor conductor patterns 402 provided on respective layers are arranged such that their inner regions within the coiled shape are overlapped with each other when looked at in a plan view. The individual inductor conductor patterns 402 provided on the respective layers are connected through conductive via holes to constitute one continuous conductor pattern. With such a configuration, a second spiral inductor with its axis extending in the stacking direction is defined by the individual inductor conductor patterns 402 provided on the respective layers and the connecting conductive via holes. Overlapped portions of the inner regions of the individual inductor conductor patterns 402 within the coiled shape define an air core portion 442 of the second inductor.

The first inductor L1 and the second inductor L2, illustrated in FIG. 1, are defined respectively by the above-mentioned first inductor and second inductor, for example.

Capacitor conductor patterns 501D, 502D and 503D are also provided on the insulator layers on which the inductor conductor patterns 401 and 402 are provided.

In more detail, the capacitor conductor pattern 501D is provided on uppermost one of the three insulator layers on which the inductor conductor patterns 401 and 402 are provided. The capacitor conductor pattern 503D is provided on intermediate one of the three insulator layers on which the inductor conductor patterns 401 and 402 are provided. The capacitor conductor pattern 502D is provided on lowermost one of the three insulator layers on which the inductor conductor patterns 401 and 402 are provided.

The capacitor conductor patterns 501D, 502D and 503D are each a conductor pattern preferably in the form of a flat plate (e.g., a rectangular plate) that has a predetermined area, and that has a flat surface parallel or substantially parallel to a flat surface of the insulator layer on which the corresponding capacitor conductor pattern is provided.

The capacitor conductor pattern 501D and the capacitor conductor pattern 503D are arranged in opposing relation over a predetermined area. With such an arrangement, a first capacitor is provided. The capacitor conductor pattern 502D and the capacitor conductor pattern 503D are also arranged in opposing relation over a predetermined area. With such an arrangement, a second capacitor is provided. The opposing area between the capacitor conductor patterns 501D and 503D and the opposing area between the capacitor conductor patterns 502D and 503D are set as appropriate depending on specifications, and those opposing areas may be the same or different from each other. The interconnected capacitors (e.g., the first capacitor Cc1 and the second capacitor Cc2), illustrated in FIG. 1, are provided respectively by the above-mentioned first capacitor and second capacitor.

The capacitor conductor patterns 501D, 502D and 503D are provided between the inductor conductor patterns 401 and the inductor conductor patterns 402.

An inner ground conductor pattern 300D is provided at the upper surface side of a lowermost insulator layer of the multilayer body 100D. The inner ground conductor pattern 300D preferably extends substantially over an entire surface of the insulator layer.

Land conductors for external connection are provided at a rear surface (rear surface of the lowermost insulator layer) of the multilayer body 100D.

Conductive via holes and predetermined layout patterns are provided on plural insulator layers (fourth to sixth layers from the top surface side in FIG. 10A) between the insulator layer on which the inner ground conductor pattern 300U is provided and uppermost one, closest to the top surface of the multilayer body 100D, of the insulator layers on which the inductor conductor patterns 401 and 402 are provided. However, those conductive via holes and predetermined layout patterns are provided at positions not overlapping with the air core portion 441 of the first inductor and the air core portion 442 of the second inductor when looking at the multilayer body 100D in a plan view.

Conductive via holes and predetermined layout patterns are further provided on plural insulator layers (tenth to fourteenth layers from the top surface side in FIG. 2) between a rearmost one of the insulator layers on which the inductor conductor patterns 401 and 402 are provided and the insulator layer on which the inner ground conductor pattern 300D is provided. However, those conductive via holes and predetermined layout patterns are provided at positions not overlapping with the air core portion 441 of the first inductor and the air core portion 442 of the second inductor when looking at the multilayer body 100D in a plan view.

The above-described configuration also provides similar advantageous effects in operation to those obtained with the above-described third and fourth preferred embodiments.

Furthermore, with the configuration of this preferred embodiment, since the capacitor conductor patterns 501D, 502D and 503D are arranged between the inductor conductor patterns 401 and the inductor conductor patterns 402, coupling between the inductor conductor patterns 401 and the inductor conductor patterns 402 is significantly reduced or prevented. Thus, characteristics of the first inductor constituted by the inductor conductor patterns 401 and characteristics of the inductor conductor patterns 402 are improved.

The multilayer body 100D', illustrated in FIG. 10B, is different from the multilayer body 100D, illustrated in FIG. 10A, in that a predetermined number of insulator layers between the insulator layer on which the inductor conductor patterns 401 and 402 are provided and the insulator layer on which the inner ground conductor pattern 300D is provided are omitted. In this respect, the number of insulator layers to be omitted is set to be smaller than the number of insulator layers, which is required to constitute the capacitors by providing the capacitor conductor patterns 501D, 502D and 503D on those insulator layers.

With the above-described configuration, the height of the multilayer body 100D' is significantly reduced while similar advantageous effects in operation to those in the first preferred embodiment are obtained. In other words, a height HD' of the multilayer body 100D' illustrated in FIG. 10B is significantly reduced to be lower than a height HD of the multilayer body 100D illustrated in FIG. 10A.

Figure 11:
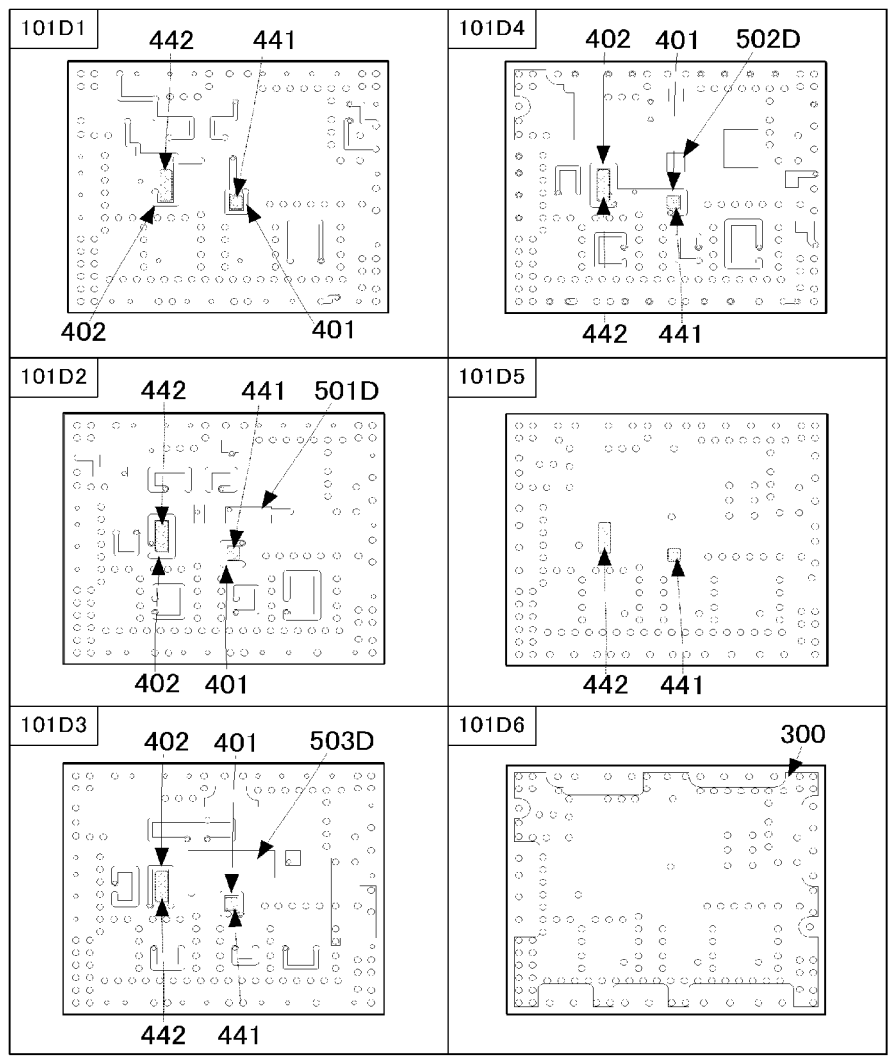
FIG. 11 illustrates, in a manner separated into individual stacked layers, a detailed multilayer structure of the multilayer body according to the fifth preferred embodiment of the present invention.

FIG. 11 illustrates, in a manner separated into individual stacked layers, a detailed multilayer structure of the multilayer body 100D according to the fifth preferred embodiment of the present invention. It is to be noted that FIG. 11 does not illustrate all the insulator layers constituting the multilayer body 100D, but illustrates only the insulator layers related to the features of the present preferred embodiment of the present invention in an extracted manner.

The inductor conductor patterns 401 and 402, each being made of a linear conductor pattern having a coiled shape, are provided on each of insulator layers 101D1, 101D2, 101D3 and 101D4. The individual inductor conductor patterns 401 and 402 on the respective layers are connected through conductive via holes per pattern group. Thus, the first inductor is defined by the individual inductor conductor patterns 401 and the connecting conductive via holes, and the second inductor is defined by the individual inductor conductor patterns 402 and the connecting conductive via holes.

The capacitor conductor pattern 501D is provided on the insulator layer 101D2. The capacitor conductor pattern 503D is provided on the insulator layer 101D3. The capacitor conductor pattern 503D is arranged in opposing relation to the capacitor conductor pattern 501D. The capacitor conductor pattern 502D is provided on the insulator layer 101D4. The capacitor conductor pattern 502D is arranged in opposing relation to the capacitor conductor pattern 503D.

Plural conductive via holes are provided in an insulator layer 101D5. The plural conductive via holes are provided at positions not overlapping with the air core portion 441 of the first inductor and the air core portion 442 of the second inductor when looking at the multilayer body 100D in a plan view.

The inner ground conductor pattern 300D is provided on an insulator layer 101D6. The inner ground conductor pattern 300D preferably extends substantially over an entire surface of the insulator layer 101D6.

With the above-described configuration, until reaching the inner ground conductor pattern 300D, there are no conductors in regions, which are defined by extending the air core portion 441 of the first inductor and the air core portion 442 of the second inductor in a direction toward the rear surface of the multilayer body 100D. As a result, magnetic fields generated from the first and second inductors are even less apt to be blocked off and characteristics of the first and second inductors are further improved. Thus, circuit characteristics of a circuit including the first and second inductors, e.g., a filter circuit such as the low pass filter illustrated in FIG. 1, are further improved.

The above-described first to fourth preferred embodiments represent the case where the air core portion 441 of the first inductor, constituted by the inductor conductor patterns 401, is not overlapped with the capacitor conductor patterns. However, the air core portion of the second inductor, constituted by the inductor conductor patterns 402, preferably is not overlapped with the capacitor conductor patterns. Alternatively, the air core portion 441 of the first inductor, including the inductor conductor patterns 401, and the air core portion of the second inductor, including the inductor conductor patterns 402, may be both made not overlapped with the capacitor conductor pattern.

Furthermore, in the configuration of the above-described second preferred embodiment, a capacitance preferably is generated between the inductor conductor patterns 401 and each of the capacitor conductor pattern 503A and the inner ground conductor pattern 300D.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A high frequency module comprising:
   a multilayer body including a plurality of insulator layers stacked on each other;
   a spiral inductor that has an axial direction aligned with a stacking direction of the plurality of insulator layers, and including inductor conductor patterns inside the multilayer body; and
   a capacitor including capacitor conductor patterns defined by at least one pair of flat-plate conductors provided on different ones of the plurality of insulator layers parallel or substantially parallel to the plurality of insulator layers; wherein
   at least one of the at least one pair of flat-plate conductors is at a position different from an air core portion of the spiral inductor when looking at the multilayer body from a direction along the stacking direction;
   the inductor conductor patterns and the capacitor conductor patterns are respectively provided on different ones of the plurality of insulator layers;
   the at least one pair of flat-plate conductors includes a first flat-plate conductor and a second flat-plate conductor that are opposed to each other in the stacking direction;
   the first flat-plate conductor is provided on an insulator layer of the plurality of insulator layers which is closer to the inductor conductor patterns than an insulator layer of the plurality of insulator layers on which the second flat-plate conductor is provided;

the first flat-plate conductor is at a position different from the air core portion of the spiral inductor when looking at the multilayer body from the direction along the stacking direction; and the second flat-plate conductor is at a position different from the air core portion of the spiral inductor when looking at the multilayer body from the direction along the stacking direction.

2. The high frequency module according to claim 1, further comprising a second inductor with an air core portion that is not overlapped by the capacitor conductor patterns.

3. The high frequency module according to claim 1, wherein the multilayer body includes at least two inductors and at least two capacitors provided therein.

4. The high frequency module according to claim 1, further comprising another capacitor conductor pattern that is configured to oppose the first flat-plate conductor and the second flat-plate conductor and is not overlapped with the air core portion.

5. The high frequency module according to claim 1, wherein the second flat-plate conductor includes a cutout or a void in which no conductors are provided, the cutout or the void overlapping with the air core portion of the spiral inductor when looking at the multilayer body from the direction along the stacking direction.

6. The high frequency module according to claim 1, wherein the capacitor conductor patterns are provided on the insulator layers on which the inductor conductor patterns are provided.

7. The high frequency module according to claim 1, wherein
the inductor conductor patterns include a first inductor conductor pattern and a second inductor conductor pattern, which constitute different inductors; and
the capacitor conductor patterns are located between the first inductor conductor pattern and the second inductor conductor pattern when looking at the multilayer body from the direction along the stacking direction.

8. The high frequency module according to claim 7, wherein the first inductor conductor pattern and the second inductor conductor pattern have a same winding direction.

9. The high frequency module according to claim 1, wherein the high frequency module is a low pass filter.

10. The high frequency module according to claim 1, wherein each of the inductor conductor patterns includes a linear conductor.

11. The high frequency module according to claim 1, wherein each of the inductor conductor patterns has a coiled shape that is partly disconnected when seen in a plan view.

12. The high frequency module according to claim 1, further comprising conductive via holes provided in the multilayer body to connect respective ones of the inductor conductor patterns.

13. The high frequency module according to claim 1, wherein the air core portion of the spiral inductor is defined by overlapped portions of inner regions of the inductor conductor patterns.

* * * * *